«12» United States Patent
Tarn et al.

(10) Patent No.: US 9,009,577 B1
(45) Date of Patent: Apr. 14, 2015

(54) CIRCUITRY AND METHOD FOR FORWARD ERROR CORRECTION (71) Applicant: Xilinx, Inc., San Jose, CA (US)

(72) Inventors: Hai-Jo Tarn, San Jose, CA (US); Krishna R. Narayanan, College Station, TX (US); Raghavendar M. Rao, Austin, TX (US); Raied N. Mazahreh, Sandy, UT (US)

(73) Assignee: Xilinx, Inc., San Jose, CA (US)

( * ) Notice: Subject to any disclaimer, the term of this patent is extended or adjusted under 35 U.S.C. 154(b) by 101 days.

(21) Appl. No.: 13/676,043

(22) Filed: Nov. 13, 2012

(51) Int. Cl.
H03M 13/15 (2006.01)
(52) U.S. Cl.
CPC ........ *H03M 13/1555* (2013.01); *H03M 13/152* (2013.01); *H03M 13/1515* (2013.01)
(58) Field of Classification Search
CPC .......... H03M 13/1515; H03M 13/151; H03M 13/1545; H03M 13/158; H03M 13/15; H03M 13/152; H03M 13/1555
USPC .................. 714/784, 781, 782, 752, 746, 755
See application file for complete search history.

(56) References Cited

U.S. PATENT DOCUMENTS

| 7,519,898 | B2 | 4/2009 | Narayanan et al. | |
| 2004/0030984 | A1* | 2/2004 | Renaud ......................... | 714/784 |
| 2011/0246852 | A1* | 10/2011 | Sabbag ......................... | 714/755 |
| 2012/0005561 | A1* | 1/2012 | Trager et al. .................. | 714/785 |
| 2013/0311847 | A1* | 11/2013 | Miyata et al. ................. | 714/755 |

OTHER PUBLICATIONS

Nguyen, P.S.; Pfister, H.D.; Narayanan, K.R., "On Multiple Decoding Attempts for Reed-Solomon Codes: A Rate-Distortion Approach," Information Theory, IEEE Transactions on , vol. 57, No. 2, pp. 668,691, Feb. 2011.*
Vardy, A.; Be'ery, Y., "Bit-level soft-decision decoding of Reed-Solomon codes," Communications, IEEE Transactions on , vol. 39, No. 3, pp. 440, 444, Mar. 1991.*
Jiang, J et al., "Iterative Soft Input Soft Output Decoding of Reed Solomon Codes by Adapting the Parity Check Matrix", IEEE Transactions on Information Theory, vol. 52, No. 8, Aug. 2006, pp. 3746-3756.
Lin, Shu et al., "Error Control Coding", $2^{nd}$ Edition, 2004, Chapter 3 to 7, pp. 66-270, Pearson Prentice Hall.

* cited by examiner

*Primary Examiner* — Albert Decady
*Assistant Examiner* — Christian Dorman
(74) *Attorney, Agent, or Firm* — LeRoy D. Maunu (57) ABSTRACT

A decoding circuit is disclosed that includes a decoding pipeline configured to receive a data block that includes a plurality of data symbols, encoded with a Reed-Solomon (RS) FEC coding thereafter further encoded by a second FEC coding. The data block also includes a first and second sets of FEC datagrams for correcting received words of the plurality of data symbols encoded with the RS FEC coding and second FEC coding, respectively. Each decoding stage of the pipeline is configured to decode the plurality of data symbols using the first and second sets of FEC datagrams. A post-processing circuit connected to an output of the pipelines is configured to perform bitwise RS decoding of ones of the plurality of data symbols in error.

16 Claims, 9 Drawing Sheets

CIRCUITRY AND METHOD FOR FORWARD ERROR CORRECTION

FIELD OF THE INVENTION

The disclosure generally relates to decoding of data blocks.

BACKGROUND

In the design of communications systems, bit error rate (BER) is a key consideration. Forward error correction (FEC) is often used to detect and correct symbols of a data packet received in error to improve the quality of transmission. FEC coding adds redundancy to a message by encoding the message prior to transmission. For FEC, some example error correction codes include Hamming, Bose-Chaudhuri-Hochquenghem (BCH), Reed-Solomon (RS), Viterbi, trellis, etc.

Several of these codes have been standardized in the International Telecommunication Union Telecommunication Standardization Sector (ITU-T). For example, the standardized Reed-Solomon (255, 239) code has a net coding gain (NCG) of 6.2 dB at a bit error rate (BER) of $10^{-15}$ (one error every $10^{15}$ bits) with 6.69% redundancy ratio. However, for high-speed (10 Gb/s and beyond) communication systems, FEC codes that are more powerful than the standard RS(255, 239) code have become necessary in order to achieve greater correction capability to compensate for serious transmission quality degradation. More recently, "Super-FEC" or "enhanced FEC (EFEC)" coding schemes have been developed that utilize a combination of two or more encoding schemes to provide greater BER correction capability and increase throughput.

One EFEC coding scheme, implements a concatenation of RS and BCH encoding schemes. The EFEC encoding process consists of a 10-bit RS encoding of 16 data groups followed by 1-bit BCH coding of 64 data groups. The optical data unit (ODU) data payload includes a total of 122,368 bits. The data payload bits are divided into sixteen groups (15 groups of 7650 bits and one group of 7620 bits). The ODU groups are encoded into RS codewords using RS(781,765) coding for the 7650-bit groups and RS(778,762) coding for the 7620-bit groups, which are both shortened codes of the RS(1023, 1007) code. The RS coding produces 16 RS coded data blocks, which include the ODU payload and RS parity data. The ODU payload and RS parity data form the first 124,928 bits of coded optical transport unit (OTU) frames. For ease of reference, RS parity data may be referred to as RS FEC datagrams, and such terms may be used interchangeably herein. Furthermore, data symbols and RS FEC datagrams in each RS coded data block may be referred to as RS codewords, and such terms may be used interchangeably herein. Parity bits used for RS correction of an RS codeword may be referred to as an RS FEC datagram, and such terms may be used interchangeably herein. For ease of reference, a received RS codeword that may possibly contain errors may be referred to as an received RS word.

Following RS coding, the 124,928 OTU bits are partitioned and interleaved into 64 groups of 1952 bits for BCH coding. Each of the 64 groups is BCH coded to produce interleaved BCH parity data. For ease of reference, the BCH parity data may be referred to as BCH FEC datagrams, and such terms may be used interchangeably herein. Symbols in each of the 64 BCH groups and the corresponding BCH FEC datagrams may be referred to as BCH codewords, and such terms may be used interchangeably herein. For ease of reference, a received BCH codeword that may possibly contain errors may be referred to as an received BCH word.

The BCH parity bits of the 64 BCH groups are appended to the end of the 124,928 OTU data bits to form a fully encoded OTU frame with a total of 130,560 bits.

Decoding is accomplished by performing one or more iterations of BCH decoding operations followed by RS decoding operations. In performing FEC decoding of data symbols after transmission, RS decoding may be used to correct up to eight 10-bit symbols in an received RSword. BCH decoding may be used to correct up to 8 bits in a received BCH word. If a received BCH word includes more bits in error than the maximum number of data bits that can be corrected, correction cannot be performed using the corresponding BCH FEC datagram and the original word will be kept and left unchanged. Correction of those bits, however, can possibly be performed using the RS FEC datagram. Similarly, if a received RS word contains more symbols in error than the maximum, the original word will be kept and left unchanged. Some of the data symbols in error may be recovered using the next BCH FEC datagram. After recovering the one or more bits using a BCH datagram, the number of data symbols in error in the received RS word may be less than the maximum number and vice-versa. If so, the remaining data symbols in error in the received RS word may be corrected using the corresponding RS FEC datagram. By iteratively alternating between BCH decoding and RS decoding, a larger number of missing data symbols or data bits may be recovered and correct codewords are restored.

However, in certain situations, errors may be present in an intersection between an received RS word and a received BCH word. If the number of errors presented in an intersection exceed the capability of both codes, neither of the decoding algorithms can recover those symbols or bits in error. For instance, 9 bits of a received BCH word in error may be included in nine different symbols of a received RS word. As a result, neither RS decoding nor BCH decoding can correct any of these errors.

One or more embodiments may address one or more of the above issues.

SUMMARY

In one embodiment, a circuit for FEC decoding is provided. The circuit includes a decoding pipeline that includes a plurality of decoding stages. The decoding pipeline is configured to receive a data block that includes a plurality of data symbols, encoded with a Reed-Solomon (RS) FEC coding thereafter further encoded by a second FEC coding. The data block also includes a first set of FEC datagrams for correcting respective received words of the plurality of data symbols encoded with the RS FEC coding and a second set of FEC datagrams for correcting respective received words of the plurality of data symbols encoded with the second FEC coding. Each decoding stage is configured to decode the plurality of data symbols with the first FEC coding using the first set of FEC datagrams and decode the plurality of data symbols with the RS coding using the second set of FEC datagrams. A post-processing circuit is coupled to an output of the decoding pipeline. In response to one of the second set of FEC datagrams indicating one of the respective received words of the plurality of data symbols encoded with the second FEC coding includes data symbols in error, the post-processing circuit performs bitwise RS decoding of ones of the plurality of data symbols in error.

In another embodiment, a method for FEC decoding is provided. A data block is received that includes a plurality of data symbols, encoded with a Reed-Solomon (RS) FEC coding thereafter further encoded by a second FEC coding, a first set of FEC datagrams for correcting respective received words of the plurality of data symbols encoded with the RS FEC coding, and a second set of FEC datagrams for correcting respective received words of the plurality of data symbols encoded with the second FEC coding. In each of a plurality of decoding iterations: the plurality of data symbols are decoded with the second FEC coding using the second set of FEC datagrams and decoded with the RS coding using the first set of FEC datagrams. After the plurality of decoding iterations, in response to one of the second set of FEC datagrams indicating one of the respective received words encoded with the second FEC coding includes data symbols in error, the plurality of data symbols included in the one of the respective received words including data symbols in error are bitwise RS decoded.

In yet another embodiment, a circuit for FEC decoding is provided. The circuit includes a decoding pipeline that includes a plurality of decoding stages. The decoding pipeline is configured to receive a data block that includes a plurality of data symbols, encoded with an RS FEC coding thereafter further encoded by a BCH FEC coding. The data block also includes a first set of FEC datagrams for correcting respective received RS words of the plurality of data symbols encoded with the RS FEC coding and a second set of FEC datagrams for correcting respective received BCH words of the plurality of data symbols encoded with the BCH FEC coding. A controller circuit is coupled to an output of the decoding pipeline. The controller circuit is configured to, for each of the received RS words, in response to one of the second set of FEC datagrams, which corresponds to one received BCH word that intersect the received RS word, indicating errors, generate a control signal. A post-processing circuit is coupled to the output of the decoding pipeline. In response to the control signal, the post-processing circuit retrieves RS syndromes, generated in the decoding the plurality of data symbols encoded with the RS coding, corresponding to the received RS word in error. The post-processing circuit is further configured to multiply each of the retrieved RS syndromes with a rotation factor to rotate the RS syndromes by a number of symbols, based on the index (10K+Y) of the one received BCH word, to correspond to an index L of a stored inverse matrix (Inv_$A_L$) that is an inverse of corresponding columns of a parity check matrix, where L=1 if Y is odd and L=2 if Y is even. The post-processing circuit is further configured to retrieve the inverse matrix (Inv_$A_L$) and multiply Inv_$A_L$ by each of the rotated syndromes to determine locations of bits in error. The post-processing circuit is further configured to offset determined locations of the bits in error by an offset based the value of Y and correct bits at the determined locations of the bits in error.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

The disclosure describes methods and systems for FEC decoding of data encoded with a concatenation of Reed-Solomon coding and a second FEC coding. For ease of description, the embodiments and examples are primarily described with reference to the example EFEC coding scheme discussed above, in which RS codewords and BCH codewords are interleaved in a data block. However, the embodiments are not necessarily so limited and are applicable to the concatenation of other types of error correction coding schemes with RS coding.

As indicated above, in certain situations, errors may be present in an intersection between a received RS word and a received BCH word beyond the correction capability of either of the codes in terms of the number of bit or symbol errors, preventing correction using either of the decoding algorithms. For instance, nine bits or more bits of a received BCH word in error may be included in nine or more different symbols of a received RS word. As a result, neither RS decoding nor BCH decoding can correct any of these errors. The disclosure describes circuits and methods for FEC decoding that perform post-processing to correct errors resulting from this scenario.

Figure 1:
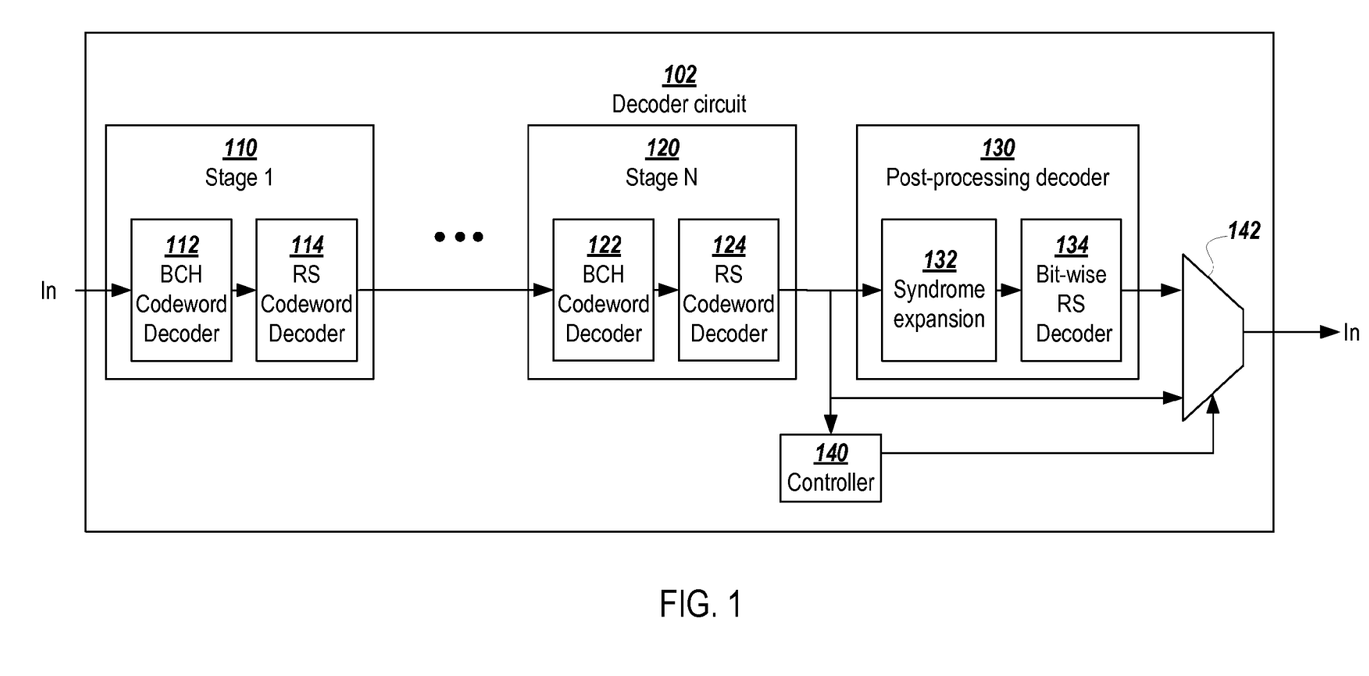
FIG. 1 shows a circuit for FEC decoding data encoded with concatenated FEC codes.

FIG. 1 shows a circuit for FEC decoding of data encoded with concatenated FEC codes. The decoding circuit 102 includes a decoding pipeline having a plurality of decoding stages (e.g., 110 and 120). The decoding circuit 102 is configured to receive a data block that includes a plurality of data symbols encoded with RS FEC coding and thereafter further encoded by BCH coding.

Each decoding stage in the decoding pipeline includes a BCH word decoder (e.g., 112 and 122) configured to perform BCH decoding of BCH words of the received data block. Each decoding stage in the decoding pipeline also includes an RS codeword decoder (e.g., 114 and 124) coupled to receive symbols of the data block decoded by the BCH decoder (e.g., 112 and 122) and configured to perform RS decoding of RS words of the received data block.

As indicated above, in certain situations, errors may be present in an intersection between a received RS word and a received BCH word, wherein the errors prevent correction using either BCH or RS decoding. The decoding circuit 102, includes a post-processing decoder 130 coupled to an output of the decoding pipeline and is configured to perform additional FEC correction to mitigate this situation.

As described in more detail with reference to FIG. 2, the post-processing decoder corrects individual bit errors in situations in which all errors in a received RS word correspond to the same received BCH word. A controller circuit 140 is configured to detect the situation in which errors are localized in one received BCH word and have not been corrected by the RS and BCH decoding in the decoding pipeline. For instance, in one implementation the controller circuit may detect this situation by checking decoded BCH and RS words to see if error flags are set. If a correctable situation is detected, the controller circuit 140 causes post-processing decoder 130 to decode erroneous bits in error and causes multiplexor 142 to select bits of the data block processed by the post-processing circuit 130 as output. Otherwise, the controller circuit 140 causes multiplexor 142 to output bits of the data block from the decoding pipeline without further processing by the post-processing circuit.

As described in more detail with reference to FIG. 2, the post-processing decoder 130 includes a syndrome expansion circuit 132 that is configured to retrieve RS syndromes of the uncorrectable received RS words, which contains errors exceeds the RS decoding capability and belong in a single BCH code. The syndrome expansion circuit 132, expands the retrieved RS syndromes allow individual bits in error to be located using RS decoding. The post-processing circuit 130 includes a bitwise RS decoder 134 that is configured to determine locations of individual bits in error using the expanded RS syndromes. For each of reference, the expanded RS syndromes may be referred to as bitwise RS syndromes and such terms may be used interchangeably herein.

Figure 2:
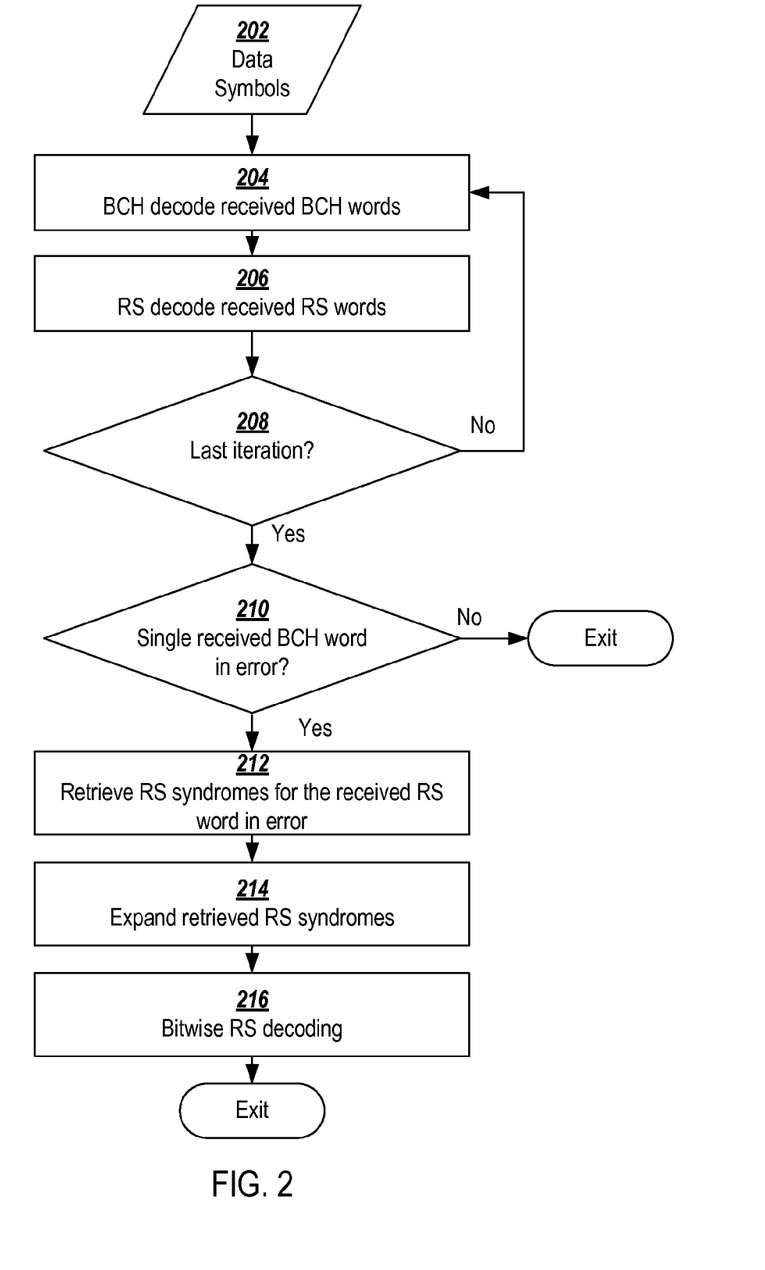
FIG. 2 shows a flowchart of a method for FEC decoding data encoded with concatenated FEC codes.

FIG. 2 shows a flowchart of a process for FEC decoding of data encoded with concatenated FEC codes. Data symbols 202 are decoded over a number of decoding iterations. In each decoding iteration, received BCH words are decoded at block 204. After BCH decoding, received RS words are decoded at block 206. The decoding of received BCH and RS words is repeated for multiple iterations. The decoding of received BCH and RS words is repeated until the last iteration has been completed as indicated by decision block 207.

After the last decoding iteration of the received RS word is completed, if none or more than two of the received BCH words are in error at decision block 210, no further decoding operations are performed. Otherwise, RS syndromes for the received RS word in error are retrieved at block 212. The retrieved RS syndromes are expanded at block 214 to produce syndromes that may be used for bitwise RS decoding. Bitwise RS decoding is performed at block 216 using the expanded syndromes to locate and correct bits of the received BCH word in error.

Figure 3:
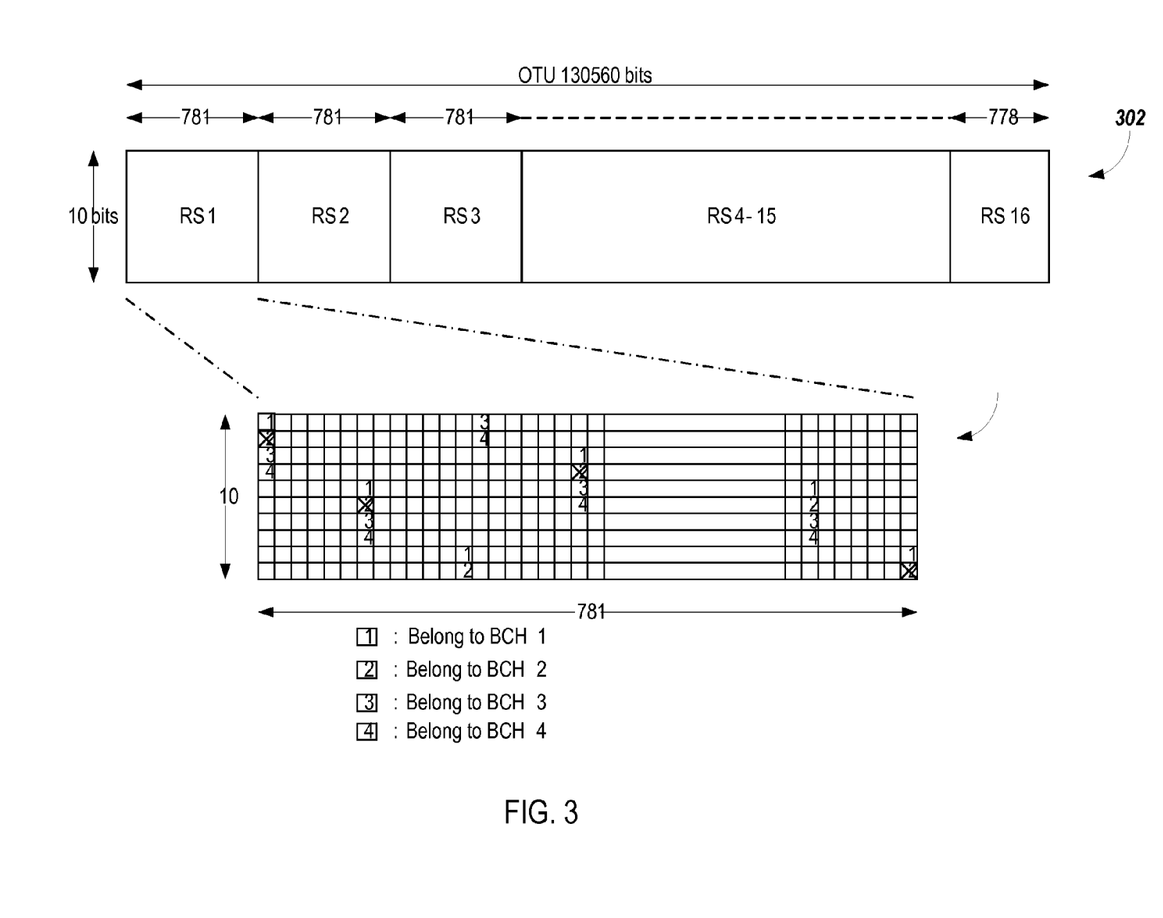
FIG. 3 depicts a scenario in which errors cannot be recovered by either BCH or RS parity codes.

FIG. 3 depicts a scenario in which errors cannot be recovered by either BCH or RS decoding. Referring again to the example EFEC coding scheme discussed above, if nine or more errors are included in the same received RS word and the same received BCH word, errors cannot be corrected using either RS or BCH decoding. FIG. 3 illustrates a distribution of data bits of four BCH words in a received RS word. The received data block 302 includes 16 RS words (RS1 though RS16). In this example, RS 1 is expanded to show individual bits in the received RS word. Bits included in received BCH words 1, 2, 3 and 4 are depicted by blocks respectively marked as 1, 2, 3, and 4 in the received RS word 310. Bits in error are identified with an "X." For ease of reference, each received BCH word (e.g., words 1, 2, 3 and 4) may alternatively be referred to as a corresponding BCH index (e.g., BCH index 1, 2, 3 and 4).

In this example, BCH data block 2 includes 9 or more errors (four of the illustrated bits are marked to indicate possible erroneous locations). In the example EFEC coding scheme discussed above, if nine or more bits in BCH data block 2 are in error, the errors cannot be recovered by repeated iterations of RS and BCH decoding. These errors could be located in any of the bits included in the specific received BCH word. The locations of these errors need to be found and the values inverted to achieve the correct codeword. However, this task is particularly difficult because there are $C_9^{122} \cong 1.22*10^{13}$ combinations of this 9-bit error pattern. Other patterns involving 10 or more bits in error may occur in a large number of combinations as well. As a result, brute force search methods are not suited to this task.

As briefly indicated above, if all bits in error in a received RS word correspond to the same received BCH word, locations of bits in error can be determined by performing bitwise RS decoding. To perform bitwise RS decoding, syndromes are expanded to convert the syndromes for processing over a binary Galois field (GF). For purposes of discussion, a brief overview of RS code is provided.

An RS code is a non-binary linear block code over $GF(p^m)$. For discussion purposes, p=2 in this example. It is conventional to express elements in $GF(2^m)$ as length-m binary numbers. An RS(r, k) code can be converted to a (r*m, k*m) binary linear block code using binary image expansion, where r is the total number of symbols (including parity check symbols) and k is the total number of data symbols in a codeword.

For instance, for a one error correcting RS(7,5) code over GF(8), there are eight possible elements (0, $\alpha^0$, $\alpha^1$, $\alpha^3$, $\alpha^3$ $\alpha^4$ $\alpha^5$ $\alpha^6$), each of the $\alpha^i$ elements is a 3-digit binary representation, and all those elements follow Galois field arithmetic. For a codeword C, $$C = \begin{bmatrix} c_1 \\ c_2 \\ \vdots \\ c_7 \end{bmatrix} \text{ and } c_i = \begin{bmatrix} c_i^1 \\ c_i^2 \\ c_i^3 \end{bmatrix} \in GF(8),$$

binary expansion produces a binary linear block code (7*3, 5*3)=(21,15). In general, an RS(r, k) code with up to t error correction capability has a parity check matrix H with dimensions of 2t×r. One form of parity check matrix can be written as $$H = \begin{bmatrix} \alpha^n & \alpha^{n-1} & \cdots & \alpha^1 & \alpha^0 \\ \alpha^{2n} & \alpha^{2(n-1)} & & \alpha^2 & \alpha^0 \\ \vdots & & \ddots & \vdots \\ \alpha^{(2t-1)n} & \alpha^{(2t-1)(n-1)} & \cdots & \alpha^{2t-1} & \alpha^0 \\ \alpha^{2tn} & \alpha^{2t(n-1)} & & \alpha^{2t} & \alpha^0 \end{bmatrix}$$

For a codeword C that does not include any bits in error, H*C=0. 0 is a zero vector with 2t×1 dimensions. When a received word $\tilde{C}$ has one or more bits in error, $H*\tilde{C}=S$ and $$S = \begin{bmatrix} s_1 \\ s_2 \\ \vdots \\ s_{2t} \end{bmatrix}.$$

where S is the vector representation of 2t syndromes.

The RS code has the capability of correcting up to t symbol errors based on 2t syndromes. After iterative decoding, all the received RS code words with less or equal to t symbol errors have been corrected. As indicated above, any remaining errors cannot be corrected using RS decoding.

To enable bitwise RS decoding, a parity check matrix of the RS code is expanded into a binary form. A first step is to construct the binary representation of a in a matrix form. The binary representation of α in a matrix form can be constructed from the primitive polynomial. For instance, in the example EFEC coding scheme discussed above, the primitive polynomial is $x^{10}+x^3+1$, a binary representation of α in a matrix form is $$\alpha = [\alpha^1\ \alpha^2\ \alpha^3\ \alpha^4\ \alpha^5\ \alpha^6\ \alpha^7\ \alpha^8\ \alpha^9\ \alpha^{10}] = \begin{bmatrix} 0 & 0 & 0 & 0 & 0 & 0 & 0 & 0 & 1 \\ 1 & 0 & 0 & 0 & 0 & 0 & 0 & 0 & 0 \\ 0 & 1 & 0 & 0 & 0 & 0 & 0 & 0 & 0 \\ 0 & 0 & 1 & 0 & 0 & 0 & 0 & 0 & 1 \\ 0 & 0 & 0 & 1 & 0 & 0 & 0 & 0 & 0 \\ 0 & 0 & 0 & 0 & 1 & 0 & 0 & 0 & 0 \\ 0 & 0 & 0 & 0 & 0 & 1 & 0 & 0 & 0 \\ 0 & 0 & 0 & 0 & 0 & 0 & 1 & 0 & 0 \\ 0 & 0 & 0 & 0 & 0 & 0 & 0 & 1 & 0 \\ 0 & 0 & 0 & 0 & 0 & 0 & 0 & 0 & 1 & 0 \end{bmatrix};$$

The parity check matrix H with the dimension of 2t×r is expanded to the binary form $H_{bin}$. $H_{bin}$ and has r*m=10230 columns and 2t*m=160 rows. The relationship (H*C=0) holds in $GF(2^m)$.

In binary form, $H_{bin} * C_{bin} = 0$, where $$C_{bin} = \begin{bmatrix} c1 \\ c2 \\ c3 \\ \vdots \\ c10230 \end{bmatrix}.$$

If errors exist, $$H_{bin} * \tilde{C}_{bin} = S_{bin} = \begin{bmatrix} s1 \\ s2 \\ s3 \\ \vdots \\ s160 \end{bmatrix}.$$

Referring again to the example EFEC coding scheme discussed above (where nine errors occur at an intersection between a received RS word and a received BCH word), since RS(781,765) is a derived shortened code from RS(1023, 1007), the first 1023−781=242 bits locations ($\widetilde{c1}$, $\widetilde{c2}$, $\widetilde{c3}$, ..., $\widetilde{c242}$) are zeros. This means the last 122 bit locations may possibly contain errors, while the rest of the bit locations are correct. We can mark those 122 locations ($\widetilde{c2422}$, $\widetilde{c2486}$, $\widetilde{c2550}$, ..., $\widetilde{c10166}$) as erasures (i.e., treat them as unknown). This situation is represented by, $$S_{bin} = H_{bin} * \begin{bmatrix} \widetilde{c1} \\ \widetilde{c2} \\ \widetilde{c3} \\ \vdots \\ \widetilde{c10230} \end{bmatrix} =$$

$$H_{bin} * \begin{bmatrix} c1 \\ c2 \\ c3 \\ \vdots \\ c10230 \end{bmatrix} + [h_{2422}, h_{2486}, h_{2550}, \ldots, h_{10166}] * \begin{bmatrix} e_{2422} \\ e_{2486} \\ e_{2550} \\ \vdots \\ e_{10166} \end{bmatrix} =$$

$$0 + A_{bin} * \begin{bmatrix} e_{2422} \\ e_{2486} \\ e_{2550} \\ \vdots \\ e_{10166} \end{bmatrix} = A_{bin} * E_{loc}$$

where $A_{bin} = [h_{2422}, h_{2486}, h_{2550}, \ldots, h_{10166}]$. $[h_{2422}, h_{2486}, \ldots h_{10166}]$ represents the 2422nd, $2486^{th}$, ..., $10166^{th}$ columns in the $H_{bin}$ matrix, respectively $E_{loc}=[e_{2422}, e_{2486}, \ldots, e_{10166}]$ represents the error value. If $e_k=0$, no error is present in the $k^{th}$ location. If $e_k=1$, the bit in the $k^{th}$ location is in error. $A_{bin}$ is a 160×122 matrix.

As discussed in more detail in the following, the error location $E_{loc}$ is recoverable if there is a submatrix of A such that $E_{loc}=A_{bin}^{-1}*S_{bin}$. The binary operations are performed in GF(2), which can be performed using bitwise operations. It is noted that the inverse of $A_{bin}$ is determined in the Galois field. This may be performed as an inversion of a square matrix in the Galois field. For instance, 122 rows can be selected from $A_{bin}$ ($A_{bin,122}$) to form a 122×122 square matrix such that Rank($A_{bin,122}$)=122. The error location can be found by $E_{loc}=A_{bin,122}^{-1}*S_{bin,122}$. $S_{bin,122}^{-1}*S_{bin,122}$ is the 122-bit syndrome in the corresponding 122 rows.

In one or more implementations, rather than calculating the inverse of $A_{bin}$ matrices during decoding, $A_{bin}$ matrices are pre-calculated and stored in a memory. Dependent upon the index of the received BCH word that is in error, a corresponding inv($A_{bin}$) is retrieved. For example, for the $j^{th}$ BCH code, inv($A_{bin}$)=inv($[h_{2240+j+64*0}, h_{2240+j+64*1}, h_{2240+j+64*2}, \ldots, h_{2240+j+64*121}]$).

Once $E_{loc}$ is calculated (which maps to the Galois field binary matrix multiplication and only "AND" and "XOR" logics are required), the $k^{th}$ bit location in the RS code where $e_k$=one is flipped, and the t+1=9 or more bit error is corrected.

Figure 4:
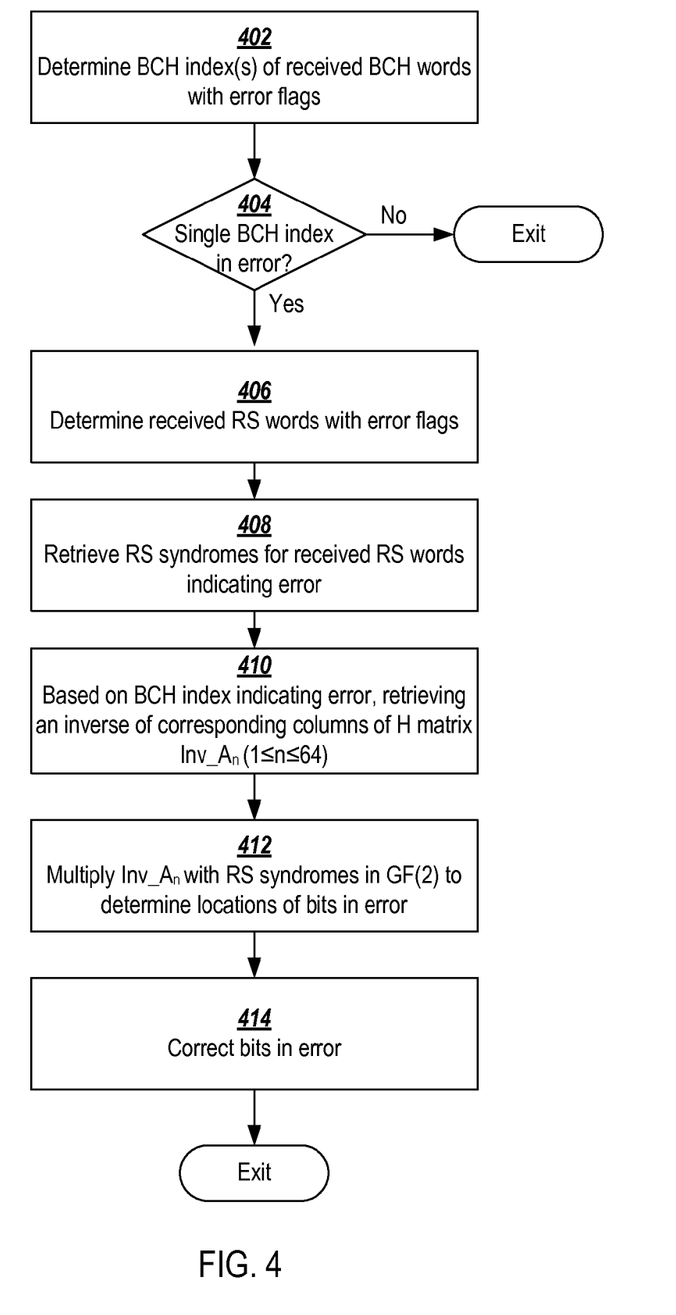
FIG. 4 shows a first method for bitwise expansion of RS syndromes and correction of a received BCH word in error.

FIG. 4 shows a first method for bitwise expansion of RS syndromes and correction of a received BCH word in error. After the last decoding iteration of the received RS word is completed, BCH indexes with failed-to-correct error flags are determined at block 402. If none or more than two received BCH words are in error at decision block 404, no further decoding operations are performed. Otherwise, received RS words (or RS indexes) with failed-to-correct error flags are determined at block 406. RS syndromes are retrieved for the received RS words indicated as being in error at block 408. Based on an index of the received BCH word in error, an inverse matrix (Inv_$A_n$) corresponding to an inverse of corresponding columns of the parity check matrix (H) is retrieved from memory at block 410. The retrieved inverse matrix (Inv_$A_n$) is multiplied by the corresponding RS syndromes in GF(2), at block 412, to determine locations of bits in error. Bits at the determined locations are corrected at block 414.

Applying this method to the example EFEC coding scheme discussed above, 64 different inverse matrices (Inv_$A_1$ through Inv_$A_N$), are required to be stored for possible retrieval at block 410. As each inverse matrix in this example application is a 122 by 122 binary matrix, and the 14,884 bits can be stored in one block RAM (of an FPGA, for example), 64 block RAMs are required to store all the required inverse matrices. Due to these large memory requirements, this approach may not be suitable for some applications.

Figure 5:
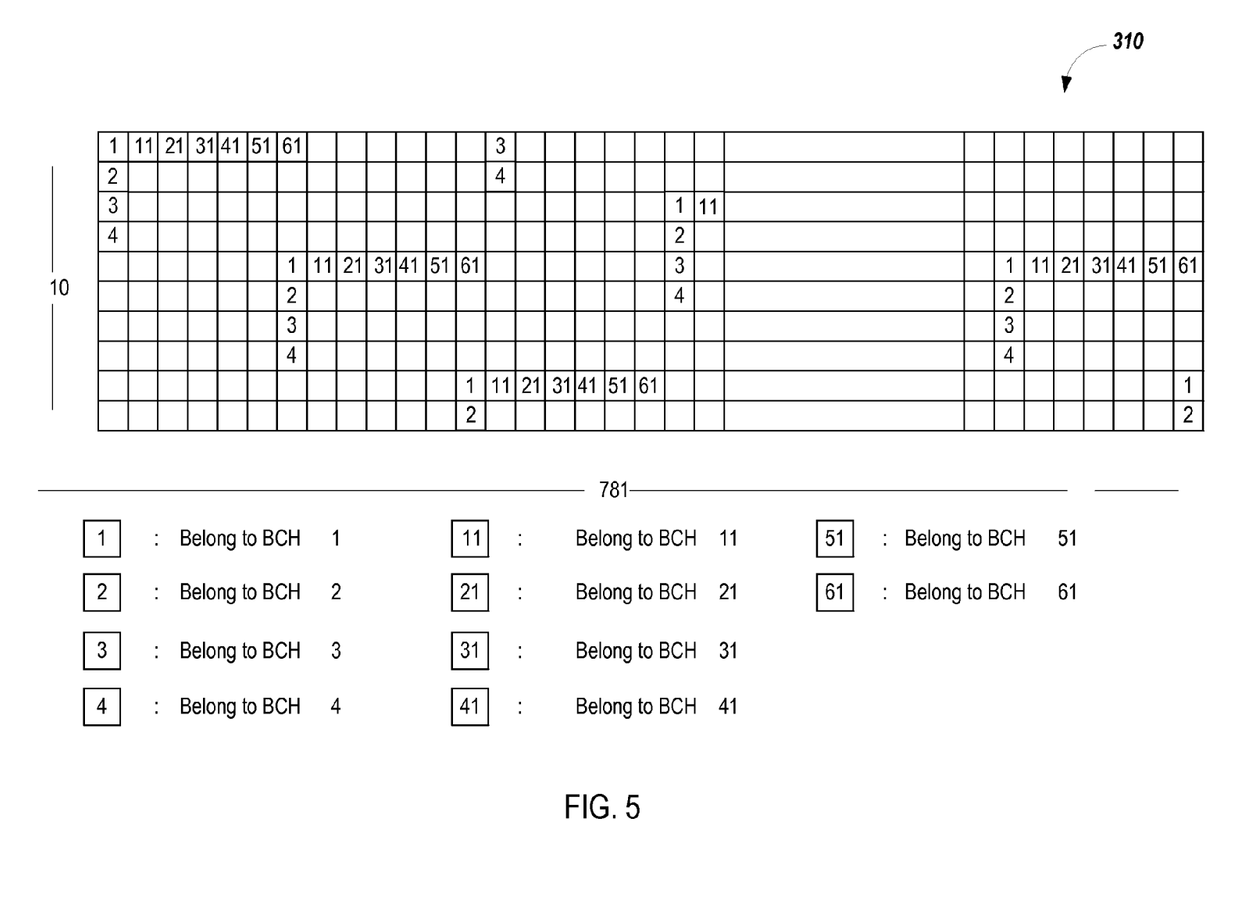
FIG. 5 depicts a first rearrangement of received words of the scenario shown in FIG. 3.

In some implementations, memory requirements may be reduced by storing only the inverse matrices corresponding to BCH indexes that have the first bit located in the first column (first 10 ten bits) in FIG. 5. The RS syndromes are rotated (e.g., cyclically shifted) by a number of symbols so bits of a different received BCH word to be corrected may be corrected using an inverse matrix corresponding to the first received BCH word. This is because the RS code is cyclic over GF(1024), therefore, when shifting the symbols of the RS code by one symbol, the resulting word is also a valid codeword. FIG. 5 illustrates shifting of RS syndromes in the received RS word 310 in FIG. 3 so bits of a different received BCH word may be corrected using an inverse matrix corresponding to the first received BCH word. For instance, if BCH index 11 is in error, after the received word is cyclically left shifted by one symbol (10 bits), it is as if the BCH index 1 is in error. The received BCH word 11 (BCH index 11) may be corrected as though the received BCH word 1 (BCH index 1) is in error as long as the syndrome of the rotated word can be determined. The erroneous bits in BCH 11 can be calculated by multiplying the syndrome of the rotated word with inverse matrix inv_$A_1$ (corresponding to the received BCH word 1). In this manner, received BCH words 11, 21, 31, 41, 51, and 61 can be corrected using one stored inverse matrix of BCH index 1. The same principle applies to other BCH indexes as well. In general, if errors are present in a received BCH word at index (10*k+y), where y is a row index 1≤y≤10 and k is a column offset 1≤k≤6, the erroneous locations can be calculated from the inverse of $A_y$ and syndromes rotated by k symbols.

Syndromes of the rotated received word are calculated by multiplying RS syndrome S for symbols at BCH index (10*k+y) by a rotation factor in GF($2^{10}$). The factor is based on the number of symbols k that the received word is shifted.

$$S_{cyclic\ shifted\ word} = S_{(10*k+m)} * \begin{bmatrix} \alpha^k \\ \alpha^{2k} \\ \alpha^{3k} \\ \vdots \\ \alpha^{16k} \end{bmatrix}$$

Applying this approach to the G. 975.1 I.4 example, only ten 122×122 matrices (Inv_$A_1$ to Inv_$A_{10}$) need to be stored to determine locations of bits in error for any of the received BCH words.

Figure 6:
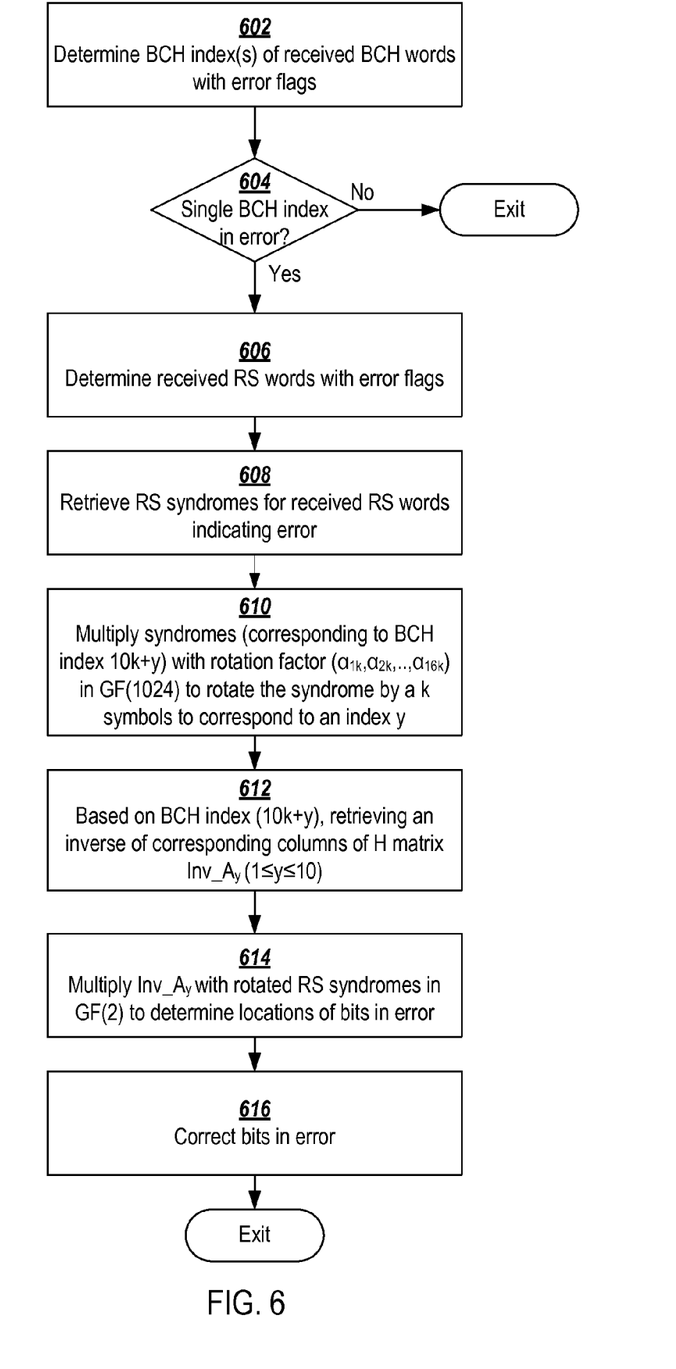
FIG. 6 shows a second method for bitwise expansion of RS syndromes and correction of a received BCH word in error.

FIG. 6 shows a second method for bitwise expansion of RS syndromes and correction of a received BCH word in error. After the last decoding iteration of the received RS word is completed, BCH indexes with failed-to-correct error flags are determined at block 402. If none or more than two received BCH words are in error at decision block 404, no further decoding operations are performed. Otherwise, An RS index with error flags set is determined at block 606. RS syndromes are retrieved for the received RS word indicated as being in error at block 608. These RS syndromes are multiplied by a rotation factor ($\alpha_{1K}, \alpha_{2K}, \ldots, \alpha_{16K}$) (if bit errors intersect with BCH index (10*k+y)) in the GF(1024), at block 610, to rotate the syndrome by k symbols to correspond to a BCH index y. Based on the BCH index y, an inverse matrix (Inv_$A_y$) of corresponding columns of the parity bit matrix H is retrieved at block 612. The retrieved inverse matrix (Inv_$A_y$) is multiplied by the rotated syndromes, at block 614, to determine locations of bits in error. Bits at the determined locations are corrected at block 616.

In some implementations, memory requirements may be further reduced by shifting received BCH words located in odd rows of the first column of the received RS word to BCH index 1, and shifting received BCH words located in even rows of the first column of the received RS word to BCH index 2.

Figure 7:
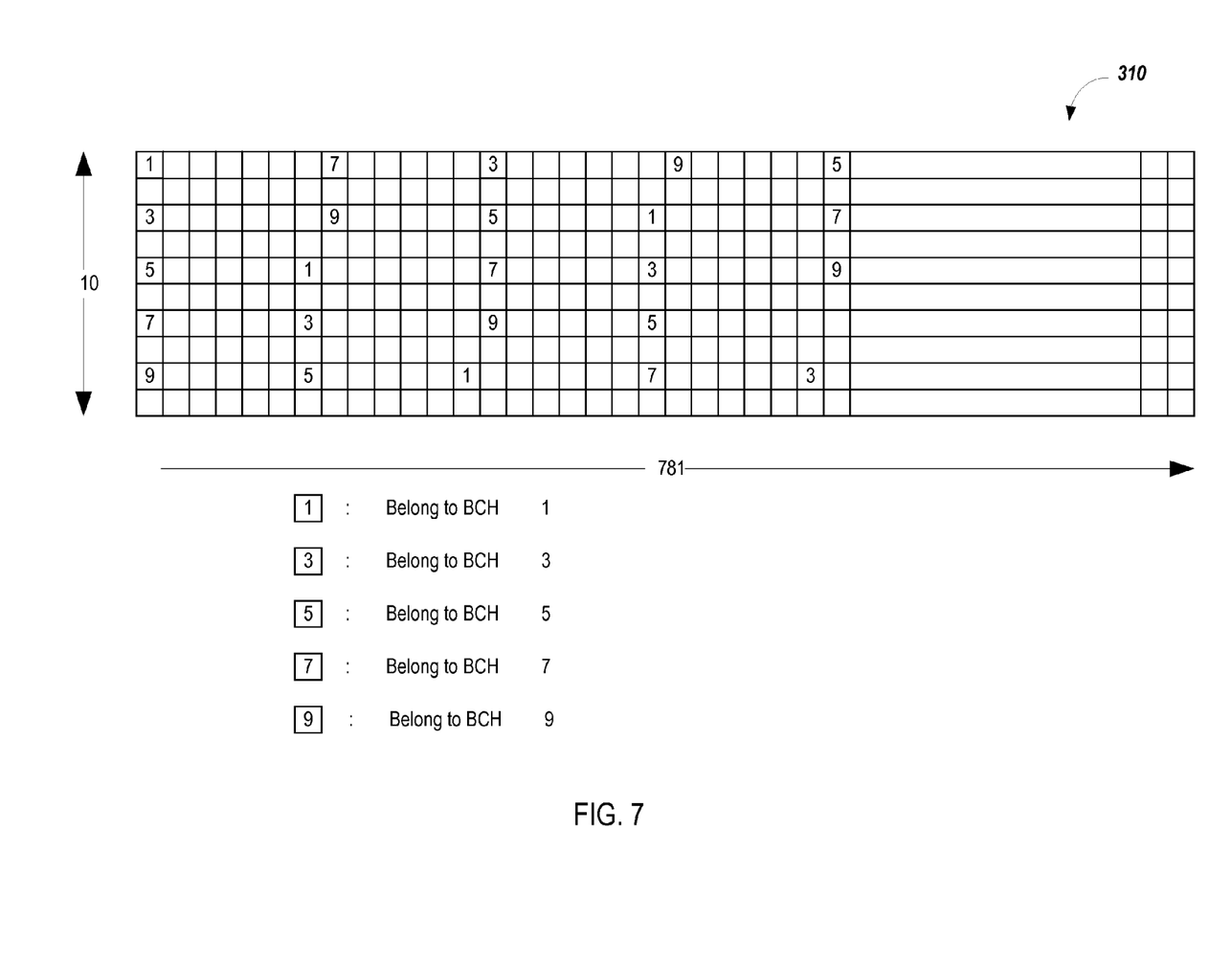
FIG. 7 depicts a second rearrangement of received words of the scenario shown in FIG. 3.

FIG. 7 illustrates shifting of RS syndromes for the received RS word 310 in FIG. 3 such that error bits of received BCH words located in the first column may be corrected using an inverse matrix corresponding to a BCH code at index 1 or 2. For instance, errors in received BCH words at indexes 3, 5, 7, and 9 may be corrected using an inverse parity matrix corresponding to the BCH index 1. Similarly, BCH bit errors at indexes 2, 4, 6, and 8 may be corrected using an inverse parity matrix corresponding to the BCH index 2.

However, after the left shifting (not shown), the $1^{st}$ to $4^{th}$ symbols of a shifted row location (for BCH index 7, 3, 9, and 5 respectively) would be shifted outside of the symbols grid shown in FIG. 7. Even though only inv_$A_i$ needs to be stored, storage is extended to four extra columns, namely $h_{2240+1+64*(-4)}$, $h_{2240+1+64*(-3)}$, $h_{2240+1+64*(-2)}$, and $h_{2240+1+64*(-1)}$. As a result, the extended inverse matrix (inv_$A_1$_ext) is a 126×126 binary matrix, equivalent to inv ([$h_{2240+1+64*(-4)}$, $h_{2240+1+64*(-3)}$, . . . , $h_{2240+1+64*0}$, $h_{2240+1+64*1}$, $h_{2240+1+64*2}$, . . . , $h_{2240+1+64*121}$]).

Similar to the rotation explained with reference to FIG. 4, the syndromes of a rotated received word are the pre-calculated syndromes for BCH index (10*k+y) multiplied with a rotation factor in the GF($2^{10}$). The rotation factor is based on the number of symbol shifting requires.

$$S_{cyclic\ shifted\ word} = S_{(10*k+y)} * \begin{bmatrix} \alpha^{k'} \\ \alpha^{2k'} \\ \alpha^{3k'} \\ \vdots \\ \alpha^{16k'} \end{bmatrix}$$

For example, for received BCH word 7 (y=7), k'=k+7. As another example, for received BCH word 3 (y=3), k'=k−13. As yet another example, for received BCH word 9 (y=9), k'=k−20.

After multiplying Inv_$A_1$_ext with the syndrome of the cyclic shifted word, the product (locations) needs to be offset by 1, 2, 3 and 4 symbols for BCH index 10*k+7, 10*k+3, 10*k+9, and 10*k+5, respectively to get the correct locations of errors. In this manner, locations of bits in error can be determined for all the odd BCH indexes using a stored inverse matrix (Inv_$A_1$_Ext). Similarly, the location for all the even BCH indexes can be generated by the inverse matrix of (Inv_$A_2$_Ext).

Applying this approach to the example EFEC coding scheme discussed above, only two 126×126 matrices (Inv_$A_1$_Ext and Inv_$A_2$_Ext) need to be stored. This is approximately 97% of memory saving in comparison to the approach discussed with reference to FIGS. 3 and 4.

Figure 8:
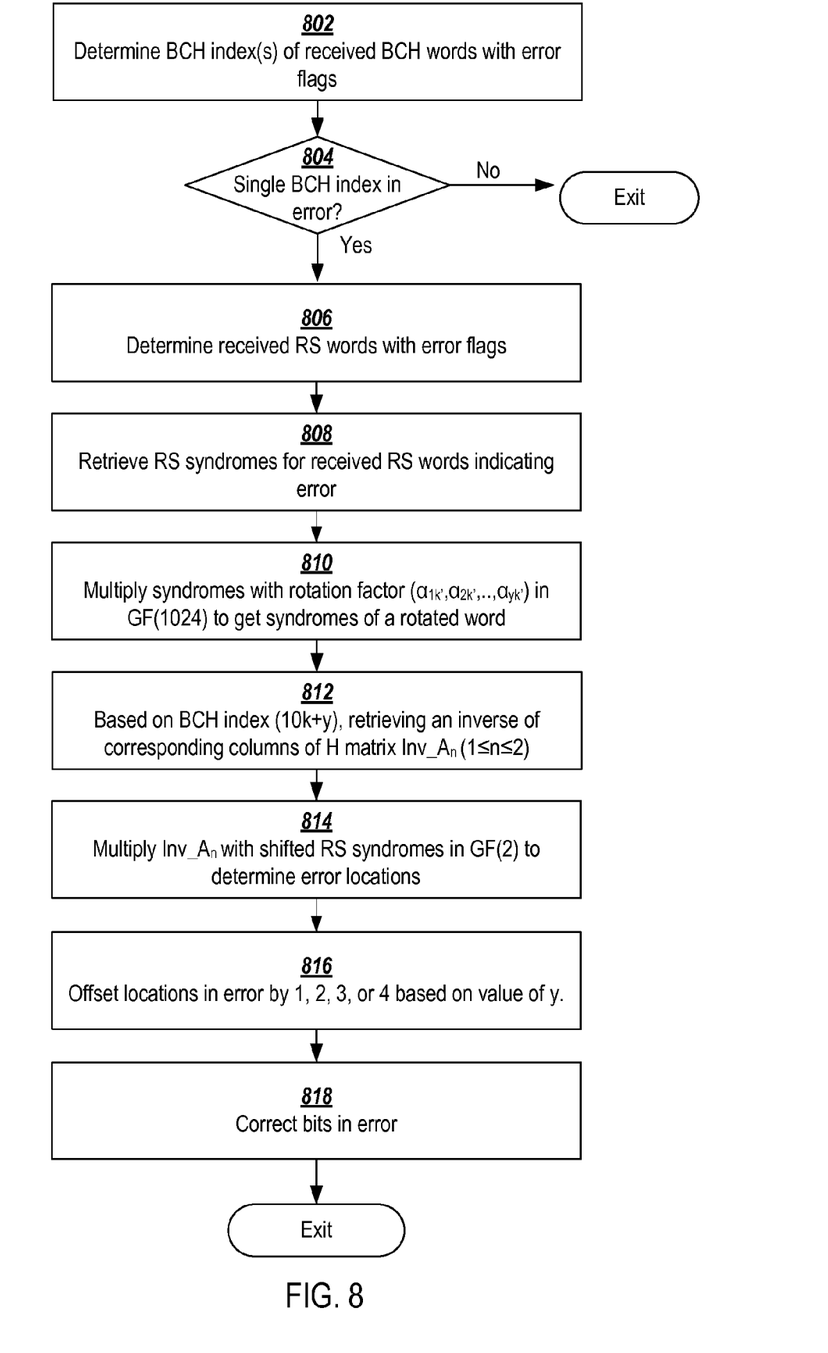
FIG. 8 shows a third method for bitwise expansion of RS syndromes and correction of a received BCH word in error.

FIG. 8 shows a third method for bitwise expansion of RS syndromes and correction of a received BCH word in error. After the last decoding iteration of the received RS word is completed, BCH indexes with failed-to-correct error flags are determined at block 802. If none or more than two of the received BCH words are in error at decision block 804, no further decoding operations are performed. Otherwise, RS index with error flags set are determined at block 806. RS syndromes are retrieved for the received RS words indicated as being in error at block 808. These RS syndromes are multiplied by a rotation factor ($\alpha_{1k'}, \alpha_{2k'}, \ldots, \alpha_{16k'}$) in GF(1024), at block 810, as discussed above. Based on the BCH index y+k of the received BCH word in error, an inverse matrix (Inv_$A_1$_Ext or Inv_$A_2$_Ext) of corresponding columns of the parity bit matrix H is retrieved at block 812. The retrieved inverse matrix is multiplied by the rotated syndromes, at block 814, to determine error locations. The error locations are shifted by an offset based on the value of y, at block 816 to determine the location of the bits in error. Bits at the determined locations are corrected at block 818.

Figure 9:
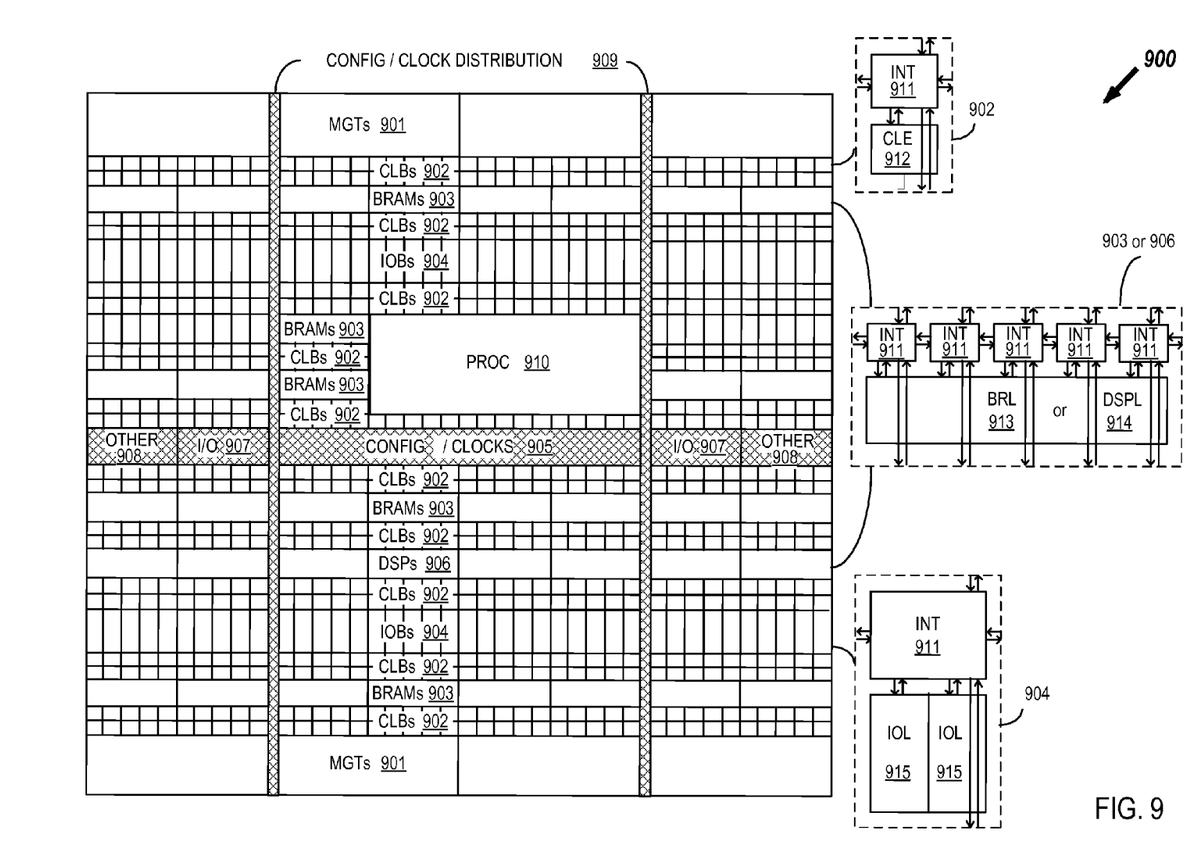
FIG. 9 shows a programmable IC that may be configured in accordance with one or more embodiments.

FIG. 9 is a block diagram of an example programmable logic integrated circuit that may be used in implementing a decoder for forward error correction in accordance with one or more of the described embodiments. A decoder for forward error correction, as previously described, may be implemented on the programmable logic and interconnect resources of a programmable integrated circuit.

FPGAs can include several different types of programmable logic blocks in the array. For example, FIG. 9 illustrates an FPGA architecture (900) that includes a large number of different programmable tiles including multi-gigabit transceivers (MGTs 901), configurable logic blocks (CLBs 902), random access memory blocks (BRAMs 903), input/output blocks (IOBs 904), configuration and clocking logic (CONFIG/CLOCKS 905), digital signal processing blocks (DSPs 906), specialized input/output blocks (I/O 907), for example, e.g., clock ports, and other programmable logic 908 such as digital clock managers, analog-to-digital converters, system monitoring logic, and so forth. Some FPGAs also include dedicated processor blocks (PROC 910) and internal and external reconfiguration ports (not shown).

In some FPGAs, each programmable tile includes a programmable interconnect element (INT 911) having standardized connections to and from a corresponding interconnect element in each adjacent tile. Therefore, the programmable interconnect elements taken together implement the programmable interconnect structure for the illustrated FPGA. The programmable interconnect element INT 911 also includes the connections to and from the programmable logic element within the same tile, as shown by the examples included at the top of FIG. 9.

For example, a CLB 902 can include a configurable logic element CLE 912 that can be programmed to implement user logic plus a single programmable interconnect element INT 911. A BRAM 903 can include a BRAM logic element (BRL 913) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 906 can include a DSP logic element (DSPL 914) in addition to an appropriate number of programmable interconnect elements. An 10B 904 can include, for example, two instances of an input/output logic element (IOL 915) in addition to one instance of the programmable interconnect element INT 911. As will be clear to those of skill in the art, the actual I/O pads connected, for example, to the I/O logic element 915 are manufactured using metal layered above the various illustrated logic blocks, and typically are not confined to the area of the input/output logic element 915.

In the pictured embodiment, a columnar area near the center of the die (shown shaded in FIG. 9) is used for configuration, clock, and other control logic. Horizontal areas 919 extending from this column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic. For example, the processor block PROC 910 shown in FIG. 9 spans several columns of CLBs and BRAMs.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual FPGA more than one adjacent column of CLBs is typically included wherever the CLBs appear, to facilitate the efficient implementation of user logic.

The embodiments are thought to be applicable to a variety of systems for forward error correction. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A circuit for forward error correction (FEC) decoding, comprising:

a decoding pipeline that includes a plurality of decoding stages and is configured to receive a data block that includes a plurality of data symbols, encoded with a Reed-Solomon (RS) FEC coding thereafter further encoded by a second FEC coding, a first set of FEC datagrams for correcting respective received words of the plurality of data symbols encoded with the RS FEC coding, and a second set of FEC datagrams for correcting respective received words of the plurality of data symbols encoded with the second FEC coding, each decoding stage configured to:

decode the plurality of data symbols with the second FEC coding using the second set of FEC datagrams; and decode the plurality of data symbols with the RS FEC coding using the first set of FEC datagrams; and a post-processing circuit coupled to an output of the decoding pipeline and configured to, in response to one of the second set of FEC datagrams indicating one of the respective received words of the plurality of data symbols encoded with the second FEC coding includes data symbols in error, perform bitwise RS decoding of ones of the plurality of data symbols in error by performing operations including:

retrieving RS syndromes, generated in the decoding the plurality of data symbols with the RS FEC coding, corresponding to symbols of the one of the respective received words that contain errors;

determining an inverse matrix that is an inverse of corresponding columns of a parity check matrix (H), based on a first index of the one of the received words encoded with second FEC coding in error;

multiplying the inverse matrix with the RS syndromes to determine locations of bits in error; and
correcting bits at the determined locations of the bits in error.

2. The circuit of claim 1, wherein
the post-processing circuit is configured to, in the performing the bitwise RS decoding of ones of the plurality of data symbols in error, multiply each of the retrieved RS syndromes with a rotation factor to rotate the retrieved RS syndromes by a number of symbols (K), based on a second index (10K+Y) of the one of the received words encoded with second FEC coding in error, to correspond to the first index of the inverse matrix, wherein the first index is equal to Y; and
wherein the RS syndromes multiplied with the inverse matrix, in the multiplying of the inverse matrix with the RS syndromes, are the rotated RS syndromes.

3. The circuit of claim 1, wherein
the post-processing circuit is configured to, in the performing the bitwise RS decoding of ones of the plurality of data symbols in error:
multiply each of the retrieved RS syndromes with a rotation factor to rotate the RS syndromes by a number of symbols, based on a second index (10K+Y) of the one of the received words encoded with second FEC coding in error, to correspond to the first index of the inverse matrix where the first index is equal to if Y is odd and is equal to if Y is even; and
offset determined locations of the bits in error by an offset based on the value of Y; and
wherein the RS syndromes multiplied with the inverse matrix, in the multiplying of the inverse matrix with the RS syndromes, are the rotated RS syndromes.

4. The circuit of claim 1, wherein:
in each of the decoding stages, the decoding the plurality of data symbols with the RS coding using the first set of FEC datagrams is performed over a Galois field including I finite elements, where I>2; and
the bitwise RS decoding is performed over a Galois field including two finite elements.

5. The circuit of claim 1, wherein, the second FEC coding is BCH coding.

6. The circuit of claim 1, further comprising, a control circuit coupled to the output of the decoding pipeline and configured to:
for each of the received words of the plurality of data symbols encoded with the RS FEC coding,
determine whether the received word includes errors; and
determine a number of the second set of FEC datagrams, corresponding to symbols included in the received word, that indicates errors.

7. The circuit of claim 6, wherein the control circuit is further configured to:
in response to determining that the received word does not include errors, cause a selection circuit to provide the plurality of data symbols output from the decoding pipeline to an output of the circuit.

8. The circuit of claim 7, wherein the control circuit is further configured to:
in response to determining that the received word includes errors and determining that only one of the second set of FEC datagrams, corresponding to symbols included in the received word, indicate errors:
cause the post-processing circuit to perform bitwise RS decoding of the ones of the plurality of data symbols in error; and
cause the selection circuit to provide the plurality of data symbols output from the post-processing circuit to the output of the circuit.

9. A method for forward error correction (FEC), comprising:
receiving a data block that includes a plurality of data symbols, encoded with a Reed-Solomon (RS) FEC coding thereafter further encoded by a second FEC coding, a first set of FEC datagrams for correcting respective received words of the plurality of data symbols encoded with the RS FEC coding, and a second set of FEC datagrams for correcting respective received words of the plurality of data symbols encoded with the second FEC coding;
in each of a plurality of decoding iterations:
decoding the plurality of data symbols with the second FEC coding using the second set of FEC datagrams; and
decoding the plurality of data symbols with the RS FEC coding using the first set of FEC datagrams; and
after the plurality of decoding iterations, in response to one of the second set of FEC datagrams indicating one of the respective received words encoded with the second FEC coding includes data symbols in error:
retrieving RS syndromes, generated in the decoding the plurality of data symbols with the RS FEC coding, corresponding to symbols of the one of the respective received words that contain errors;
expanding the retrieved RS syndromes to generate a set of bitwise RS syndromes; and
performing bitwise RS decoding of each of the plurality of data symbols, included in the one of the respective received words including data symbols in error, using the set of bitwise RS syndromes; and
wherein the expanding the retrieved RS syndromes to generate a set of bitwise RS syndromes and the performing RS decoding using the set of bitwise RS syndromes includes:
determining an inverse matrix that is an inverse of corresponding columns of a parity check matrix (H), based on a first index of the one of the received words encoded with second FEC coding in error;
multiplying the inverse matrix with the retrieved RS syndromes to determine locations of bits in error; and
correcting bits at the determined locations of the bits in error.

10. The method of claim 9, wherein:
in each of the decoding iterations, decoding the plurality of data symbols with the RS FEC coding using the first set of FEC datagrams is performed over a Galois field including I finite elements, where I>2; and
RS decoding using the set of bitwise RS syndromes is performed over a Galois field including two finite elements.

11. The method of claim 9, further comprising:
after the plurality of decoding iterations, in response to one of the respective received words of the plurality of data symbols encoded with the second FEC coding containing an error, performing one or more additional decoding iterations.

12. The method of claim 9, further comprising:
after the plurality of decoding iterations, checking the first set of FEC datagrams to determine one of the corresponding received words of the plurality of data symbols, encoded with the first FEC coding, that is in error.

13. The method of claim 9, wherein, the second FEC coding is BCH coding.

14. The method of claim 9, wherein:
  expanding the retrieved RS syndromes to generate a set of bitwise RS syndromes and the performing RS decoding using the set of bitwise RS syndromes further includes multiplying each of the retrieved RS syndromes with a rotation factor to rotate the RS syndromes by a number of symbols (K), based on a second index (10K+Y) of the one of the received words encoded with second FEC coding in error, to correspond to the first index of the inverse matrix, wherein the first index is equal to Y; and
  wherein the RS syndromes multiplied with the inverse matrix, in the multiplying of the inverse matrix with the RS syndromes, are the rotated RS syndromes.

15. The method of claim 9, wherein:
  expanding the retrieved RS syndromes to generate a set of bitwise RS syndromes and the performing RS decoding using the set of bitwise RS syndromes further includes:
    multiplying each of the retrieved RS syndromes with a rotation factor to rotate the RS syndromes by a number of symbols, based on a second index (10K+Y) of the one of the received words encoded with the second FEC coding in error, to correspond to the first index of the inverse matrix, wherein the first index is equal to 1 if Y is odd and is equal to 2 if Y is even; and
    offsetting determined locations of the bits in error by an offset based on the value of Y; and
  the RS syndromes multiplied with the inverse matrix, in the multiplying of the inverse matrix with the RS syndromes, are the rotated RS syndromes.

16. A circuit for forward error correction (FEC) decoding, comprising:
  a decoding pipeline that includes a plurality of decoding stages and is configured to receive a data block that includes a plurality of data symbols, encoded with a Reed-Solomon (RS) FEC coding thereafter further encoded by a BCH FEC coding, a first set of FEC datagrams for correcting respective received RS words of the plurality of data symbols encoded with the RS FEC coding, and a second set of FEC datagrams for correcting respective received BCH words of the plurality of data symbols encoded with the BCH FEC coding, each decoding stage configured to:
    decode the received BCH words using the second set of FEC datagrams; and
    decode the received RS words using the first set of FEC datagrams;
  a controller circuit coupled to an output of the decoding pipeline and configured to, for each of the received RS words, in response to one of the second set of FEC datagrams, which corresponds to one received BCH word that intersects the received RS word, indicating errors, generate a control signal; and
  a post-processing circuit coupled to the output of the decoding pipeline and configured to, in response to the control signal:
    retrieve RS syndromes, generated in the decoding the plurality of data symbols encoded with the RS FEC coding, corresponding to the received RS word in error;
    multiply each of the retrieved RS syndromes with a rotation factor to rotate the RS syndromes by a number of symbols, based on an index (10K+Y) of the one received BCH word, to correspond to an index L of a stored inverse matrix ($Inv\_A_L$) that is an inverse of corresponding columns of a parity check matrix, where L=1 if Y is odd and L=2 if Y is even;
    retrieve the inverse matrix ($Inv\_A_L$);
    multiply $Inv\_A_L$ by each of the rotated RS syndromes to determine locations of bits in error;
    offset determined locations of the bits in error by an offset based on the value of Y; and
    correct bits at the determined locations of the bits in error.

* * * * *